(12) United States Patent
Funyu et al.

(10) Patent No.: US 7,405,680 B2
(45) Date of Patent: Jul. 29, 2008

(54) DISTORTION COMPENSATOR

(75) Inventors: Yasuhito Funyu, Kawasaki (JP); Hiroaki Abe, Kawasaki (JP); Takeshi Ohba, Kawasaki (JP); Tomohiro Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 433 days.

(21) Appl. No.: 10/851,707

(22) Filed: May 20, 2004

(65) Prior Publication Data

US 2005/0104758 A1    May 19, 2005

(30) Foreign Application Priority Data

Nov. 14, 2003    (JP)    ............... 2003-385156

(51) Int. Cl.
*H03M 1/06*    (2006.01)

(52) U.S. Cl. ................. 341/118; 341/119; 375/349; 375/297

(58) Field of Classification Search ............. 341/118, 341/119, 120; 375/349, 297, 252, 254, 284, 375/285, 296; 330/149
See application file for complete search history.

(56) References Cited

U.S. PATENT DOCUMENTS

| | | | | |
|---|---|---|---|---|
| 5,126,687 A | * | 6/1992 | Onoda et al. ............... | 330/149 |
| 5,732,112 A | * | 3/1998 | Langberg .................... | 375/349 |
| 5,917,373 A | | 6/1999 | Twitchell | |
| 5,920,808 A | | 7/1999 | Jones et al. | |
| 5,978,415 A | * | 11/1999 | Kobayashi et al. .......... | 375/230 |
| 6,091,941 A | * | 7/2000 | Moriyama et al. .......... | 455/126 |
| 6,418,173 B1 | * | 7/2002 | Matsuoka et al. ........... | 375/297 |
| 6,552,609 B2 | * | 4/2003 | Hamada et al. ............. | 330/149 |
| 6,697,436 B1 | * | 2/2004 | Wright et al. ............... | 375/296 |
| 2002/0071476 A1 | * | 6/2002 | Park | |
| 2003/0053552 A1 | * | 3/2003 | Hongo et al. | |
| 2004/0022178 A1 | * | 2/2004 | Kishi | |

FOREIGN PATENT DOCUMENTS

| | | |
|---|---|---|
| GB | 2 337 169 | 11/1999 |
| GB | 2 379 109 | 2/2003 |
| JP | 63-208330 | 8/1988 |
| JP | 2000-201099 | 7/2000 |
| JP | 200278190 A | 10/2000 |
| JP | 2001-189685 | 7/2001 |
| JP | 2001-345718 | 12/2001 |
| JP | 2003-060447 | 2/2003 |
| JP | 2003-142950 | 5/2003 |

OTHER PUBLICATIONS

Ode et al. (US PGPUB 2001/0007435), "Distortion compensation apparatus", filed on Dec. 14, 2000.*
Ezuka (US PGPUB 2003/0231058), "Transmission Amplifier", filed on Dec. 14, 2000.*
Partial British Search Report dated Oct. 18, 2004.

* cited by examiner

*Primary Examiner*—Jean B Jeanglaude
(74) *Attorney, Agent, or Firm*—Katten Muchin Rosenman LLP

(57) ABSTRACT

A distortion compensator updating and selecting a distortion compensation coefficient applied to a digital transmission signal so as to reduce the difference between the digital transmission signal and a digital feedback signal is disclosed. The distortion compensator includes a control part that controls the level of an input signal to an analog-to-digital conversion part outputting the digital feedback signal in accordance with the magnitude of the amplitude of the digital transmission signal.

16 Claims, 7 Drawing Sheets

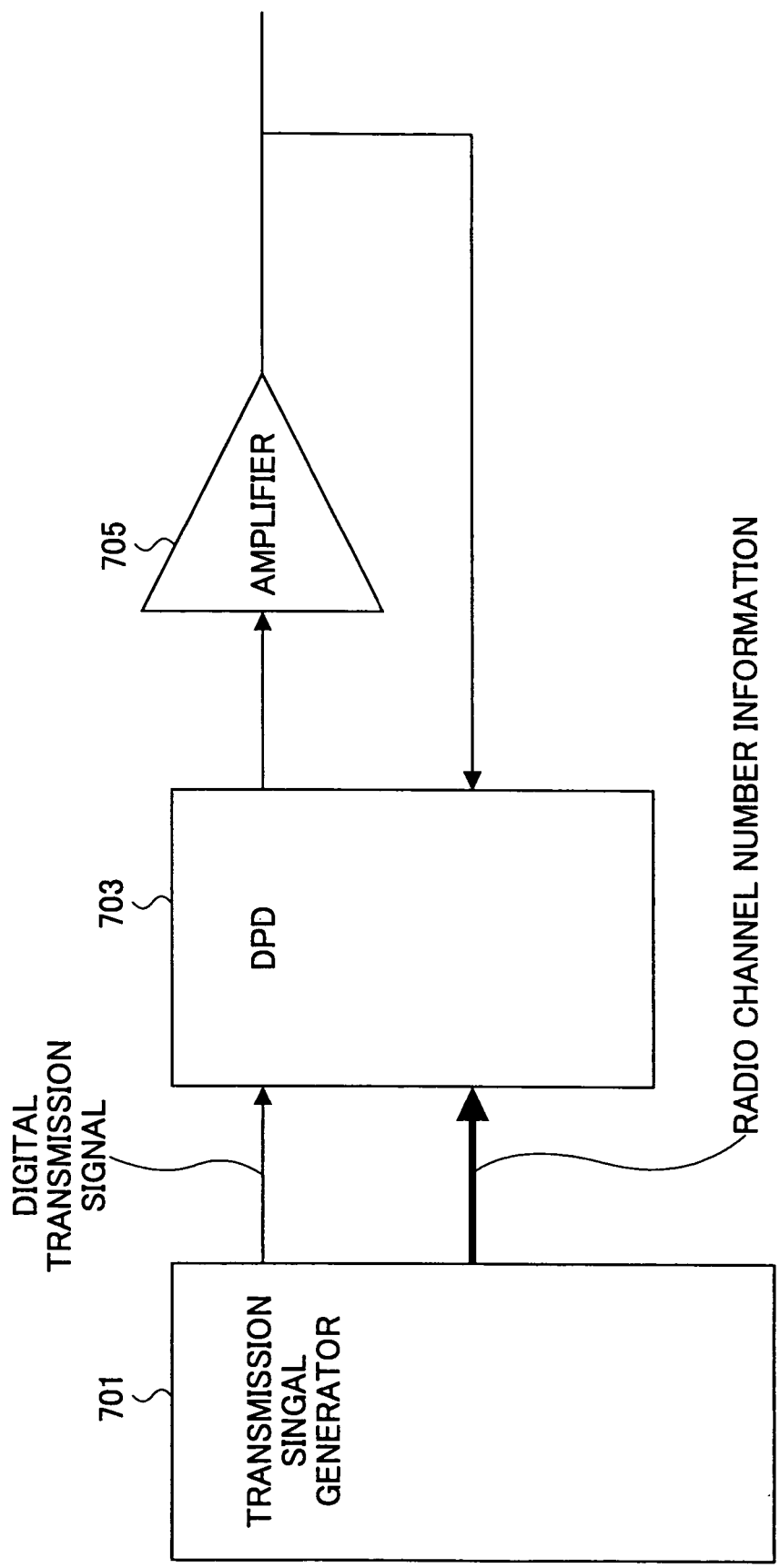

DISTORTION COMPENSATOR

BACKGROUND OF THE INVENTION

1. Field of the Invention

The present invention relates generally to nonlinear distortion compensators in radio transmitters, and more particularly to a distortion compensator of a digital pre-distortion type.

2. Description of the Related Art

In this type of technical field, the digital pre-distortion (DPD) technique has been widely used to compensate for the nonlinear distortion of a transmission signal caused by the power amplifier of a radio transmitter.

FIG. 1 is a block diagram showing part of a radio transmitter with a DPD distortion compensation function. Referring to FIG. 1, the radio transmitter includes a DPD unit 102, a digital-to-analog converter part (D/A) 104, a frequency converter part 106, a high frequency amplifier part 108, a distributor part 110, a frequency converter part 112, and an analog-to-digital converter part (A/D) 114. The DPD unit 102 includes an amplitude and phase correction part 116, a look-up table 118, an error detection part 120, and a delay part (D) 122.

A modulated baseband digital transmission signal is input to the DPD unit 102, where the digital transmission signal is corrected by pre-distortion compensation. Thereafter, the digital transmission signal is converted into an analog transmission signal in the D/A 104. The analog transmission signal is frequency-converted to a radio frequency signal by the frequency converter part 106, and is amplified in the high frequency amplifier part 108 to be transmitted by radio from an antenna part (not graphically represented) via the distributor part 110. On the other hand, the transmission signal is extracted by the distributor part 110 as a feedback signal, and is frequency-converted to a baseband signal in the frequency converter part 112 to be input to the A/D 114. The output of the A/D 114 is input to the DPD unit 102. The high frequency amplifier part 108 and the other analog elements may provide distortion to a signal to be transmitted because of not only their own nonlinear characteristics but also their dependence on the environment of use, such as variations in temperature and over time. The distortion is detected in the error detection part 120 of the DPD unit 102 as the difference or error between the digital feedback signal from the A/D 114 and the digital transmission signal, whose timing has been adjusted by being delayed by the delay part 122 so as to be compared with the feedback signal. In the DPD unit 102, the distortion compensation coefficients of the look-up table 118 are adaptively updated so as to reduce the error detected in the error detection part 120. Then, an appropriate distortion compensation coefficient is selected in accordance with the level of the digital transmission signal, and the digital transmission signal is multiplied by the selected distortion compensation coefficient in the amplitude and phase correction part 116. The distortion compensation coefficient functions to predistort the amplitude and phase of the digital transmission signal so as to offset nonlinear distortion components introduced into the transmission signal by the analog elements. For instance, Japanese Laid-Open Patent Applications No. 63-208330, 2001-345718, and 2001-189685 disclose distortion compensators as described above.

The amplitude of the modulated baseband digital transmission signal varies in level from high to low. Therefore, a feedback signal of a high amplitude level is obtained for a digital transmission signal of a high amplitude level, and a feedback signal of a low amplitude level is obtained for a digital transmission signal of a low amplitude level. In this case, if the amplitude level of the analog feedback signal input to the A/D 114 is lowered, the number of bits effectively used in the A/D 114 is reduced. As a result, the accuracy of the digital feedback signal may be reduced.

The lowest amplitude level of a digital transmission signal may be as low as approximately one several-hundredth of its highest amplitude level, or be lower than its highest amplitude level by tens of dB. If the number of bits of the A/D 114 is 12, the A/D 114 may represent $2^{12}=4096$ amplitude levels. If the highest amplitude level, which is 4096, is reduced to $\frac{1}{128}$ ($2^{-7}$) thereof, the amplitude level becomes $32=2^5$, which is a reduction of approximately 20 dB. When the amplitude level is 32, only five of the 12 bits of the A/D 114 are used, which means that the remaining seven bits are not effectively used. If the number of bits effectively used in the A/D 114 is thus reduced, the accuracy of the digital feedback signal generated therein and the accuracy of the error signal generated in the error detection part 120 may be decreased, resulting in a reduction of the accuracy of distortion compensation.

SUMMARY OF THE INVENTION

Accordingly, it is a general object of the present invention to provide a distortion compensator in which the above-described disadvantage is eliminated.

A more specific object of the present invention is to provide a distortion compensator that can control the degradation of distortion compensation accuracy due to transmission of a low-level signal in a transmitter employing digital distortion compensation.

Another more specific object of the present invention is to provide a radio transmitter and a wireless base station that can control the degradation of distortion compensation accuracy due to transmission of a low-level signal.

One or more of the above objects of the present invention are achieved by a distortion compensator updating and selecting a distortion compensation coefficient applied to a digital transmission signal so as to reduce a difference between the digital transmission signal and a digital feedback signal, the distortion compensator including a control part configured to control a level of an input signal to an analog-to-digital conversion part outputting the digital feedback signal in accordance with magnitude of amplitude of the digital transmission signal.

One or more of the above objects of the present invention are also achieved by a distortion compensator updating and selecting a distortion compensation coefficient by which a digital transmission signal is multiplied so as to reduce a difference between the digital transmission signal and a digital feedback signal, the distortion compensator including: a variable gain amplification part configured to autonomously control a level of an input signal to an analog-to-digital conversion part outputting the digital feedback signal; and a control part configured to control an amplitude level of the digital transmission signal for calculating the difference in response to the controlling of the level of the input signal by the variable gain amplification part.

One or more of the above objects of the present invention are also achieved by a distortion compensator updating and selecting a distortion compensation coefficient by which a digital transmission signal is multiplied so as to reduce a difference between the digital transmission signal and a digital feedback signal, the distortion compensator including: a variable gain amplification part configured to control a level of an input signal to an analog-to-digital conversion part outputting the digital feedback signal in response to a control signal; and a gain control part configured to output the control signal in accordance with a power value of the digital transmission signal using a predetermined correspondence between possible power values of the digital transmission signal and gains of the variable gain amplification part.

One or more of the above objects of the present invention are also achieved by a radio transmitter with a distortion compensation function, including any of the above-described distortion compensators.

One or more of the above objects of the present invention are further achieved by a wireless base station with a common amplifier for amplifying a transmission signal with respect to a plurality of channels, the wireless base station including: a pre-distortion compensation part configured to provide pre-distortion to the transmission signal before being amplified in the common amplifier; a comparison part configured to control the pre-distortion provided in the pre-distortion compensation part so as to reduce a difference between the transmission signal before being amplified and a feedback signal thereof obtained by feeding back the transmission signal after being amplified, based on a result of comparison of the transmission signal before being amplified and the feedback signal thereof; and a level control part configured to increase a difference between the transmission signal before being amplified and the feedback signal thereof compared in the comparison part by increasing a level of the transmission signal before being amplified and a level of the feedback signal thereof in accordance with a decrease in the level of the transmission signal before being amplified.

BRIEF DESCRIPTION OF THE DRAWINGS

Other objects, features and advantages of the present invention will become more apparent from the following detailed description when read in conjunction with the accompanying drawings, in which:

FIG. 7 is a block diagram showing part of a radio transmitter according to a third embodiment of the present invention.

DETAILED DESCRIPTION OF THE PREFERRED EMBODIMENTS

A description is given below, with reference to the accompanying drawings, of embodiments of the present invention.

Figure 1:
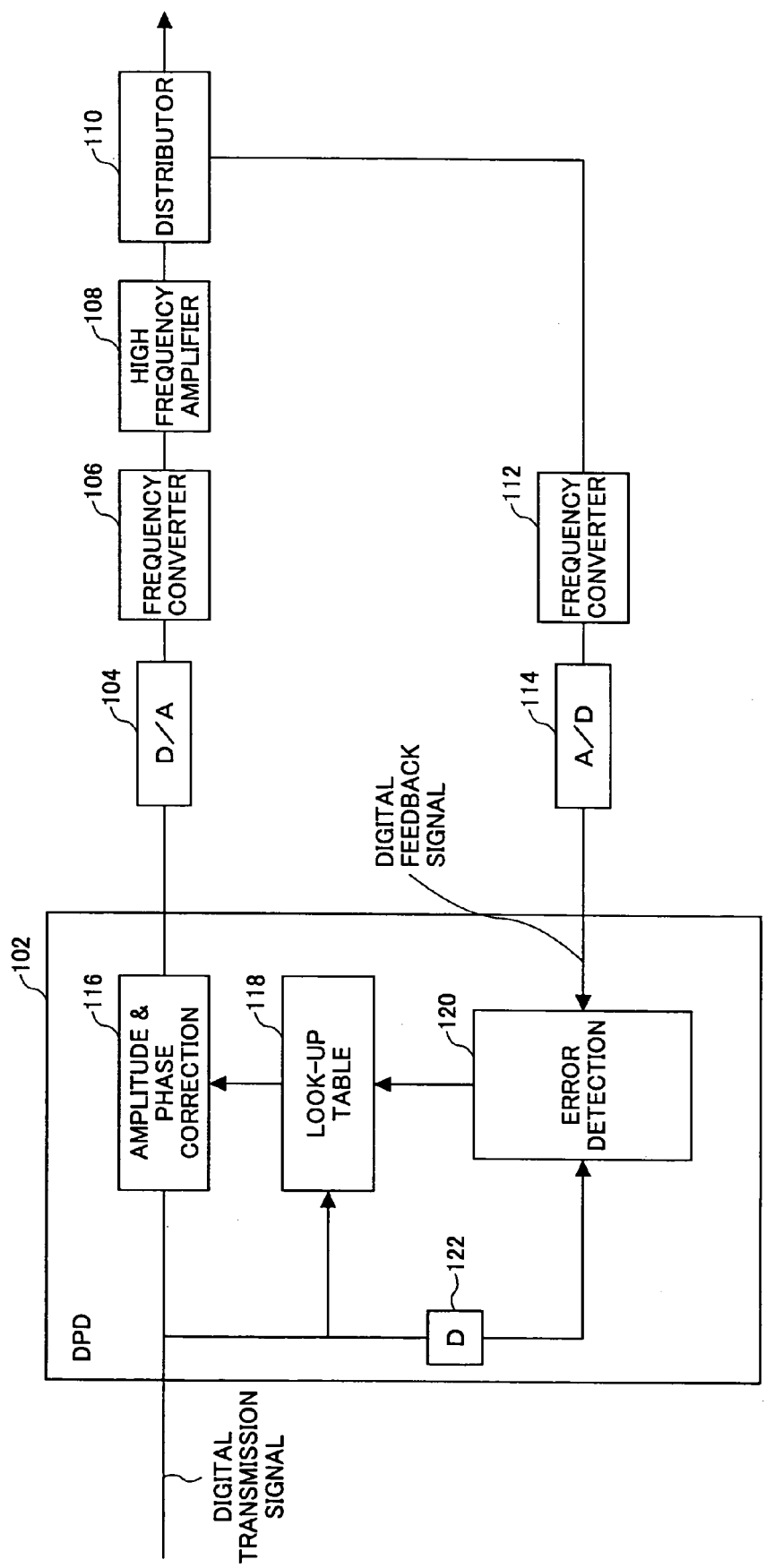
FIG. 1 is a block diagram showing part of a conventional radio transmitter.
Figure 2:
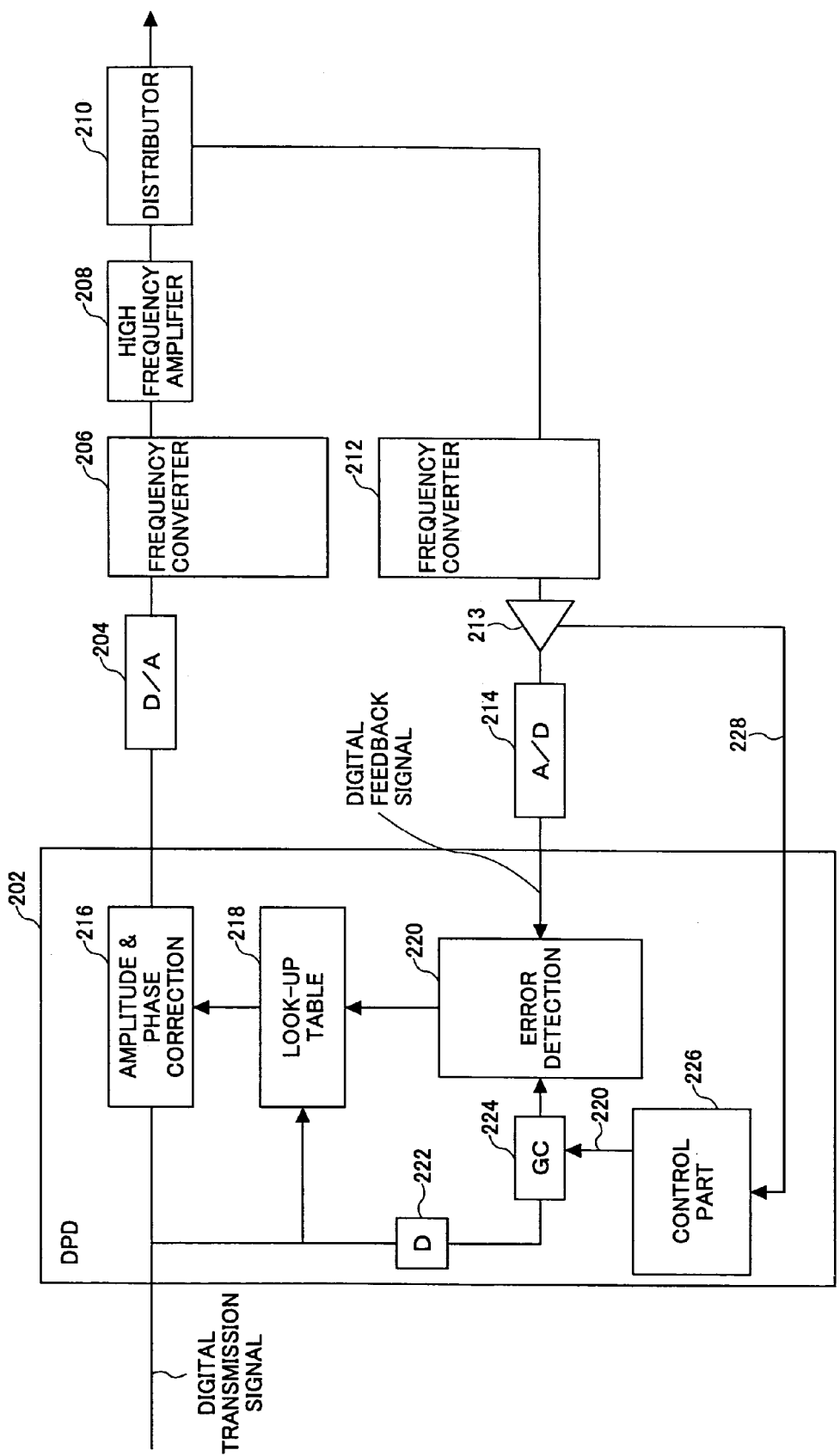
FIG. 2 is a block diagram showing part of a radio transmitter according to a first embodiment of the present invention.

FIG. 2 is a block diagram showing part of a radio transmitter having a distortion compensation function using the DPD technique according to a first embodiment of the present invention. Referring to FIG. 2, the radio transmitter includes a DPD unit 202, a digital-to-analog converter part (D/A) 204, a frequency converter part 206, a high frequency amplifier part 208, a distributor part 210, a frequency converter part 212, a variable gain amplifier part 213, and an analog-to-digital converter part (A/D) 214. The DPD unit 202 includes an amplitude and phase correction part 216, a look-up table 218, an error detection part 220, a delay part (D) 222, a gain setting part (GC) 224, and a control part 226. The control part 226 is connected to the variable gain amplifier part 213 so as to receive a notification therefrom.

A modulated baseband digital transmission signal, which is, for instance, a signal subjected to code spreading, is input to the DPD unit 202 and corrected therein. Thereafter, the digital transmission signal is converted into an analog transmission signal in the D/A 204. The modulation is, for instance, a primary modulation that is spread processing using a spread code. The analog transmission signal is frequency-converted to a radio frequency signal by the frequency converter part 206, and is amplified in the high frequency amplifier part 208 to be transmitted by radio from an antenna part (not graphically represented) via the distributor part 210. For convenience of description, processing such as conversion to an intermediate frequency band, if any, is omitted. On the other hand, the transmission signal is extracted by the distributor part 210 as a feedback signal, and is frequency-converted to a baseband signal in the frequency converter part 212 to be input to the A/D 214 via the variable gain amplifier part 213. The output of the A/D 214 is input to the DPD unit 202.

In the DPD unit 202, the error detection part 220 detects the difference or error between the digital feedback signal from the A/D 214 and the digital transmission signal, whose timing has been adjusted by being delayed by the delay part 222 so as to be compared with the feedback signal. The distortion compensation coefficients of the look-up table 218 are adaptively updated so as to reduce the error detected in the error detection part 220. Then, an appropriate distortion compensation coefficient is selected in accordance with the level of the digital transmission signal, and the digital transmission signal is multiplied by the selected distortion compensation coefficient in the amplitude and phase correction part 216. The distortion compensation coefficient functions to predistort the amplitude and phase of the digital transmission signal so as to offset nonlinear distortion components introduced into the transmission signal by the analog elements.

The variable gain amplifier part 213 operates autonomously to raise the amplitude level of the analog feedback signal input thereto when the amplitude level of the analog feedback signal is low. For instance, the variable gain amplifier part 213 detects the amplitude level of the analog feedback signal, and controls its gain so as to make constant the level of an input signal to the A/D 214. Alternatively, the variable gain amplifier part 213 may detect the amplitude level of the analog feedback signal, and may operate to amplify the amplitude level by a predetermined gain when the amplitude level is lower than a predetermined value. Further, the variable gain amplifier part 213 notifies the control part 226 of a change in the gain of the feedback channel through a control line 228. The control part 226 controls the gain of the gain setting part 224 to the same gain in accordance with the notification from the variable gain amplifier part 213.

The variable gain amplifier part 213 maintains the amplitude level of the input signal to the A/D 214 higher than or equal to a certain value. As a result, the degradation of the accuracy of distortion compensation caused by a low level signal, which is a problem in the conventional configuration, can be effectively controlled. As a result of a change in the gain or rate of amplification of the feedback channel caused by the variable gain amplifier part 213, the amplitude level of the digital feedback signal output from the A/D 214 is also changed. Accordingly, the change should be considered in error detection in the error detection part 220. Otherwise, the error detection part 220 cannot determine whether the detected difference in amplitude level is due to nonlinear distortion introduced by the analog elements or a change in the gain of the variable gain amplifier part 213. As a result, in the latter case, the distortion compensation coefficients are inappropriately updated. Using the variable gain amplifier part 213, the gain setting part 224, and the control part 226, the gains of both channels connected to the error detection part 220 can be suitably maintained, and the above-described problem can be eliminated.

Figure 3:
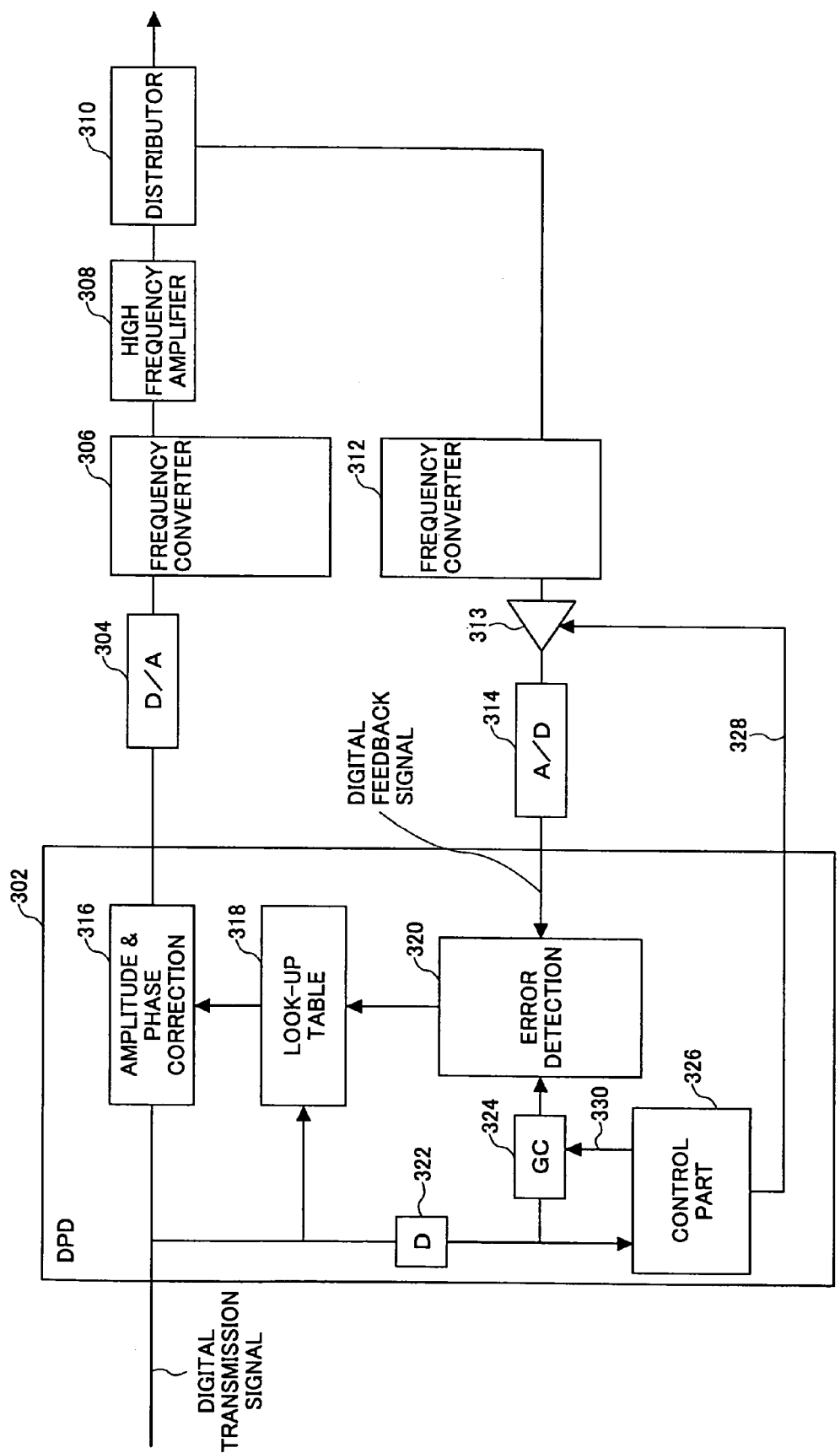
FIG. 3 is a block diagram showing part of a radio transmitter according to a second embodiment of the present invention.

FIG. 3 is a block diagram showing part of a radio transmitter with a distortion compensation function using the DPD technique according to a second embodiment of the present invention. Referring to FIG. 3, the radio transmitter includes a DPD unit 302, a digital-to-analog converter part (D/A) 304, a frequency converter part 306, a high frequency amplifier part 308, a distributor part 310, a frequency converter part 312, a variable gain amplifier part 313, and an analog-to-digital converter part (A/D) 314. The DPD unit 302 includes an amplitude and phase correction part 316, a look-up table 318, an error detection part 320, a delay part (D) 322, a gain setting part (GC) 324, and a control part 326. The control part 326 is connected to the variable gain amplifier part 313 through a control line 328, and is connected to the gain setting part 324 through a control line 330.

A modulated baseband digital transmission signal is input to the DPD unit 302 and subjected to pre-distortion compensation therein. Thereafter, the digital transmission signal is converted into an analog transmission signal in the D/A 304. The analog transmission signal is frequency-converted to a radio frequency signal by the frequency converter part 306, and is amplified in the high frequency amplifier part 308 to be transmitted by radio from an antenna part (not graphically represented) via the distributor part 310. On the other hand, the transmission signal is extracted by the distributor part 310 as a feedback signal, and is frequency-converted to a baseband signal in the frequency converter part 312 to be input to the A/D 314 via the variable gain amplifier part 313. The output of the A/D 314 is input to the DPD unit 302.

In the DPD unit 302, the distortion compensation coefficients of the look-up table 318 are adaptively updated so as to reduce the difference between the digital transmission signal and the digital feedback signal from the A/D 314. Then, an appropriate distortion compensation coefficient is selected in accordance with the level of the digital transmission signal, and the digital transmission signal is multiplied by the selected distortion compensation coefficient in the amplitude and phase correction part 316.

Figure 4:
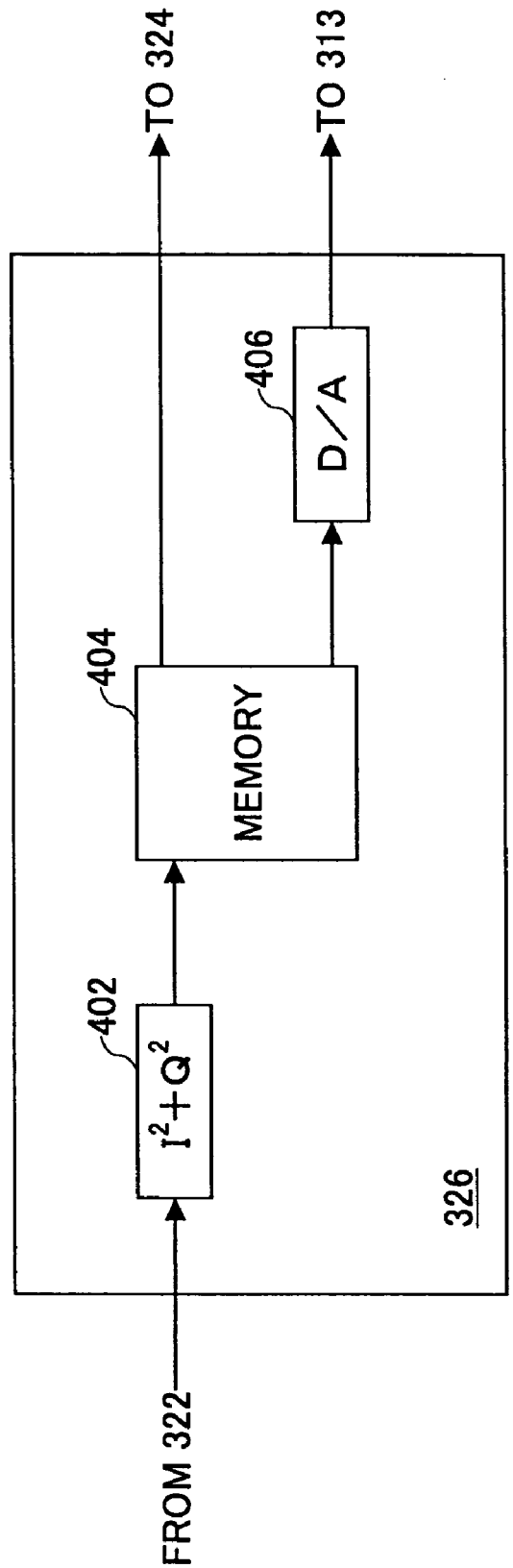
FIG. 4 is a block diagram showing a configuration of a control part according to the second embodiment of the present invention.

It is possible to know, before the distortion compensation operation is performed, the maximum and minimum values of the amplitude level of the digital transmission signal, that is, how much the power of the digital transmission signal changes. In the above-described case, for instance, it is possible to know, before the digital transmission signal is input to the DPD 302, that the minimum (lowest) value of the 4096 ($=2^{12}$) amplitude levels is approximately 32 ($=2^5$). Accordingly, when the digital transmission signal is input to the DPD unit 302, it is possible to predict the amplitude level of the feedback signal of the digital transmission signal without any nonlinear distortion. If the feedback signal of a low amplitude level is suitably amplified based on the prediction, it is possible to effectively use the bits of the A/D 314. Accordingly, the control part 326 stores the correspondence among a possible power value of the digital transmission signal, the gain A of the variable gain amplifier part 313, and the gain B of the gain setting part 324 in a memory 404 (FIG. 4). Every time the digital transmission signal is input to the DPD unit 302, the control part 326 refers to the memory 404, and outputs a control signal through the control line 328 based on the correspondence. The correspondence is such that a greater gain is correlated with a lower amplitude level. The variable gain amplifier part 313 amplifies the analog feedback signal by a gain indicated by the received control signal, and provides the analog feedback signal whose amplitude level has been amplified to the A/D 314.

A change in the gain of the variable gain amplifier part 313 changes the gain of the feedback channel. Accordingly, as in the first embodiment of FIG. 2, the gain on the feedback signal side and the gain on the digital transmission signal side should also be suitably matched with each other in this embodiment. Accordingly, when the gain of the variable gain amplifier part 313 is changed, the control part 326 provides a control signal to the gain setting part 324 through the control line 330 so that the gain of the gain setting part 324 is also changed.

FIG. 4 is a block diagram showing a configuration of the control part 326. Referring to FIG. 4, the control part 326 includes a power measurement part ($I^2+Q^2$) 402, the memory 404, and a digital-to-analog converter part (D/A) 406. The power measurement part 402 calculates a power value by adding the square of the in-phase component and the square of the quadrature component of the input digital transmission signal. The power value is used to specify an address of the memory 404. The memory 404 stores data or information defining the correspondence among a possible amplitude level or power value (input address) of the digital transmission signal, the gain of the variable gain amplifier part 313, and the gain of the gain setting part 324. Unlike the contents of the look-up table 318, which are updated every time the digital transmission signal and the error signal are input, the information stored in the memory 404 may be constant. The contents of the memory 404 are provided to the variable gain amplifier part 313 through the D/A 406 and to the gain setting part 324. The control signal output to the variable gain amplifier part 313 goes through the D/A 406 because the variable gain amplifier part 313 operates in an analog region. The control signal output to the gain setting part 324 does not go through the D/A 406 because the gain setting part 324 operates in a digital region. The memory 404 may be configured as follows:

| Power | 1st Gain | 2nd Gain |
|---|---|---|
| $P_1$ | $A_1$ | $B_1$ |
| $P_2$ | $A_2$ | $B_2$ |
| ... | ... | ... |
| $P_{4096}$ | $A_{4096}$ | $B_{4096}$ |

In this case, a gain $A_i$ of the variable gain amplifier part 313 and a gain $B_i$ of the gain setting part 324 are set for each of the 4096 ($=2^{12}$) power values $P_i$, for instance. It is assumed that the power values are arranged in ascending order from $P_1$. The first gain $A_i$ and the second gain $B_i$ are set so that a greater gain is provided to a smaller power value. For instance, if $A_{4096}$ is set to 1, ..., $A_{32}$ is set to 128, ..., even in the case of transmitting a signal of a small power value such as $P_{32}$, it is possible to effectively use the bits of the A/D 314 as in the case of transmitting a signal of a great power value such as $P_{4096}$.

Figure 5:
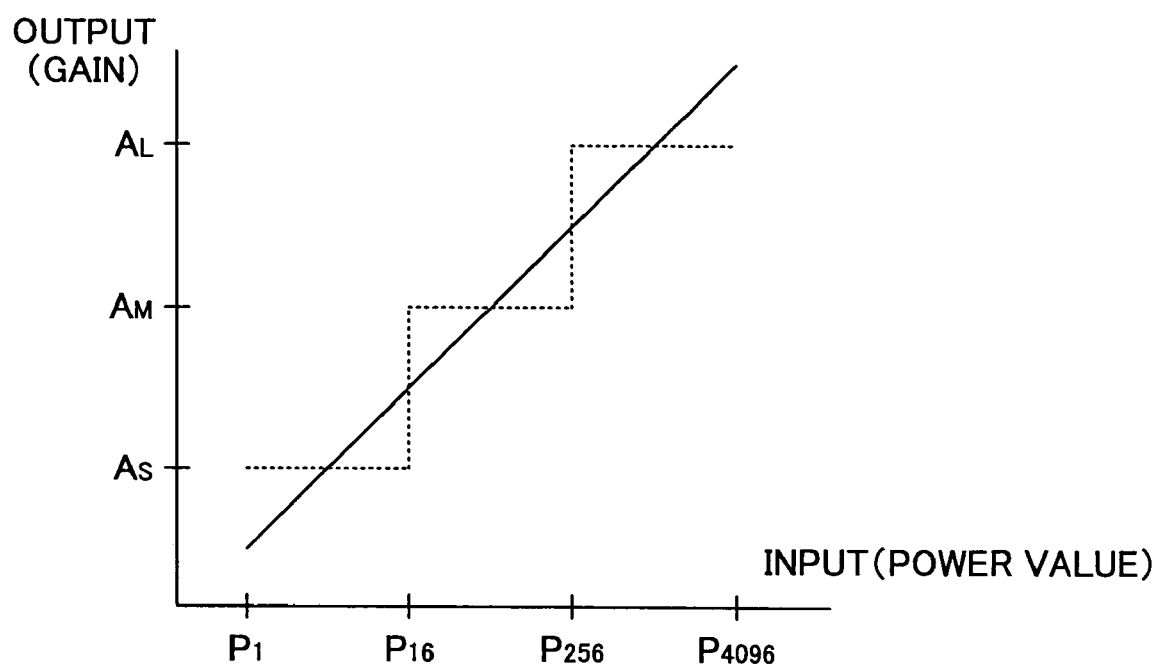
FIG. 5 is a graph showing a power value-gain correspondence according to the second embodiment of the present invention.

FIG. 5 is a graph showing power value-gain correspondence according to this embodiment. The gains $A_i$ of the variable gain amplifier part 313 and the gains $B_i$ of the gain setting part 324 are set successively so as to have a one-to-one correspondence to the power values $P_i$ as indicated by the solid line of FIG. 5. As a variation, the same gain $A_i$ or $B_i$ may be provided for multiple power values $P_i$. For instance, as indicated by the broken line of FIG. 5, it is possible to limit the gain to three values ($A_S$, $A_M$, and $A_L$). It is also possible to set the number of gain values to other than three. By thus setting the same gain for multiple power values, the storage space of the memory 404 may be saved. As described above, there is no need to update the stored contents of the memory 404 as frequently as those of the look-up table 318. Accordingly, it is also possible to fix the contents of the memory 404. Further, multiple information items each indicating such a fixed correspondence (for instance, a correspondence as indicated by the solid line of FIG. 5 and a correspondence as indicated by the broken line of FIG. 5) may be prepared so that a suitable one of the correspondences may be selected in accordance with a communication situation.

Figure 6:
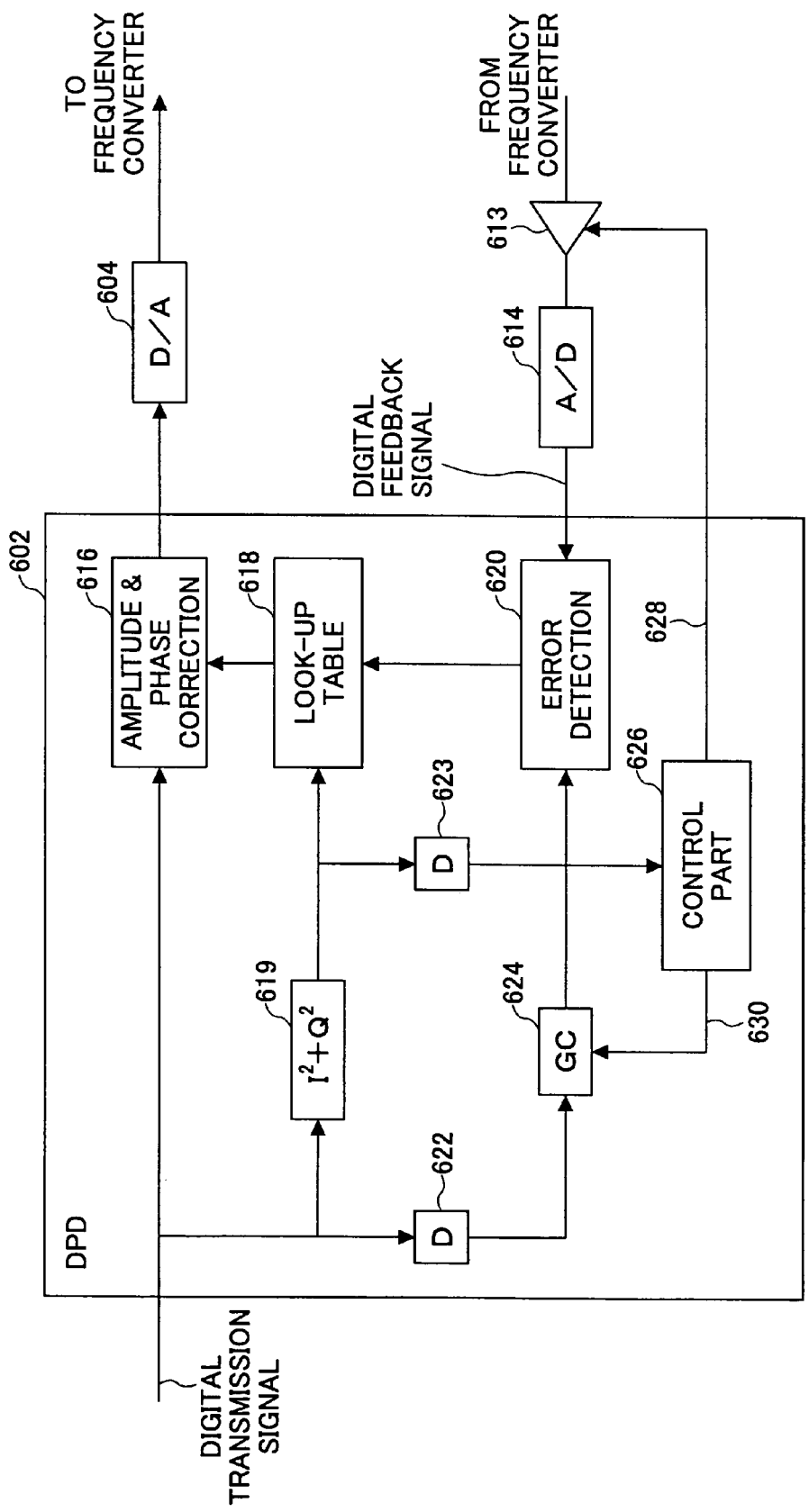
FIG. 6 is a block diagram showing another DPD unit according to the second embodiment of the present invention.

FIG. 6 is a block diagram showing another DPD unit 602, which may replace the DPD unit 302 of FIG. 3, according to this embodiment. Referring to FIG. 6, the DPD unit 602 includes an amplitude and phase correction part 616, a look-up table 618, a power calculation part 619, an error detection part 620, delay parts (Ds) 622 and 623, a gain setting part 624, and a control part 626. The control part 626 is connected to a variable gain amplifier part 613 through a control line 628 and to the gain setting part 624 through a control line 630.

The distortion compensation coefficients of the look-up table 618 are adaptively updated based on the power value of the digital transmission signal and the error signal provided from the error detection part 620 so as to reduce the error between the digital transmission signal and the digital feedback signal from the A/D 614. The control part 626 outputs a control signal to the variable gain amplifier part 613 and/or the gain setting part 624 in accordance with the power value of the digital transmission signal. Thus, the power value-related information is used in both the look-up table 618 and the control part 626. Therefore, calculation workload is reduced by sharing the power value calculation result therebetween. In the case of FIG. 6, the power value calculated in the power calculation part 619 is input to the look-up table 618 and is also provided to the control part 626 via the delay part 623. In this case, the power calculation part 402 as shown in FIG. 4 may be dispensed with.

According to the second embodiment shown in FIGS. 3 through 6, if the level of a signal input to the A/D 314 (614) is low, the level is suitably amplified. As a result, the degradation of the accuracy of distortion compensation, which is a problem in the conventional configuration, can be effectively controlled. The second embodiment is different from the first embodiment (FIG. 2) in that the variable gain amplifier part 313 (613) provided in the feedback channel is controlled through the channel formed by the control part 326 (626) and the control line 328 (628). In the first embodiment (FIG. 2), the variable gain amplifier part 214 detects a low amplitude level of the feedback signal, autonomously amplifies the feedback signal to raise its amplitude level, and provides the amplified feedback signal to the A/D 214. The variable gain amplifier part 214 notifies the control part 226 of the change in the gain of the feedback channel. The gain of the gain setting part 224 is controlled based on the notification. Detection of the level of the feedback signal and control of the gain of the variable gain amplifier part 213 are performed in an analog region. Therefore, a certain response delay occurs before the input level of the A/D 214 becomes constant. That is, a certain period of time is required to stabilize the input level of the A/D 214.

On the other hand, according to the second embodiment, every time the digital transmission signal is input to the DPD unit 302 (602), the control part 326 (626) provides a control signal to the variable gain amplifier part 313 (613). Detection of the level of the digital transmission signal and determination of the contents of the control signal are immediately performed in a digital region without using the feedback signal obtained from the distributor part 310. Accordingly, the variable gain amplifier part 313 (613) can amplify the feedback signal early. As a result, a response delay introduced in the first embodiment of FIG. 2 can be effectively reduced.

FIG. 7 is a block diagram showing part of a radio transmitter according to a third embodiment of the present invention. The radio transmitter of FIG. 7, which may be installed in, for instance, a wireless base station for CDMA (Code Division Multiple Access), includes a transmission signal generator part 701, a DPD unit 703, and an amplifier part 705. The DPD unit 703 and the amplifier part 705 are equal to those corresponding elements described above. The transmission signal generator part 701 generates and outputs digital transmission signals for multiple radio channels, which are amplified in a common amplifier and transmitted. The transmission signal generator part 701 has information on the number of radio channels for the digital transmission signals to be amplified. The DPD unit 703 (for instance, the control part 326 inside the DPD unit 302 shown in FIG. 3) is notified of this radio channel number information as indicated by solid arrow in FIG. 7. This is advantageous in that the DPD unit 703 can dispense with a transmission level detector.

Using the radio channel number information, the DPD unit 703 performs gain control on a variable gain amplifier part (for instance, the element denoted by reference numeral 313 in FIG. 3) and a gain setting part (for instance, the element denoted by reference numeral 324 in FIG. 3) based on the number of channels so that the variable gain amplifier part and the gain setting part have the same gain.

At this point, the gain control is performed so that the gain decreases as the number of radio channels increases and the gain increases as the number of radio channels decreases. If a radio channel is special for performing communications at high speed, it is preferable not to treat the radio channel as equal to the other radio channels. Therefore, in this case, the DPD unit 703 is further notified of information on radio channel types. Thus, it is desirable that the gain control be performed with accurate determination as to the magnitude of a transmission signal.

According to the third embodiment, the transmission signal generator part 701 notifies the DPD unit 703 of the radio channel number information. It is desirable that the transmission signal generator part 701 also notify the DPD unit 703 of other information relating to the transmission signal level. For instance, if the transmission signal generator part 701 performs transmission power control individually on each channel, the accuracy of estimation of the transmission signal level may be reduced with knowing only the number of radio channels. Therefore, in this case, the DPD unit 703 may be notified of the signal level of each channel after the transmission power control (or of parameters used for the transmission power control), and calculate the total of the signal levels of the channels after the transmission power control (or the sum of the transmission signal levels obtained based on the parameters). Then, the DPD unit 703 may perform gain control on the variable gain amplifier part 313 and the gain setting part 324 based on the calculated total of the signal levels of the channels after the transmission power control so that the variable gain amplifier part 313 and the gain setting part 324 have the same gain. The gain control is performed so that the gain decreases as the transmission signal level increases and the gain increases as the transmission signal level decreases.

The present invention is not limited to the specifically disclosed embodiments, and variations and modifications may be made without departing from the scope of the present invention.

The present application is based on Japanese Priority Patent Application No. 2003-385156, filed on Nov. 14, 2003, the entire contents of which are hereby incorporated by reference.

What is claimed is:

1. A distortion compensator updating a distortion compensation coefficient applied to a digital transmission signal so as to reduce a difference between the digital transmission signal and a digital feedback signal the distortion compensator comprising:

a control part configured to control, in a feedback system, a level of an input signal to an analog-to-digital conversion part outputting the digital feedback signal to be compared with the digital transmission signal in accordance with magnitude of amplitude of the digital transmission signal.

2. The distortion compensator according to claim 1, wherein the control part performs the control by monitoring the level of the input signal or by using the digital transmission signal.

3. A distortion compensator updating a distortion compensation coefficient by which a digital transmission signal is multiplied so as to reduce a difference between the digital transmission signal and a digital feedback signal, the distortion compensator comprising:

a variable gain amplification part configured to control, in a feedback system, a level of an input signal to an analog-to-digital conversion part outputting the digital feedback signal to be compared with the digital transmission signal in response to a control signal; and a gain control part configured to output the control signal in accordance with a power value of the digital transmission signal by using a predetermined correspondence between possible power values of the digital transmission signal and gains of the variable gain amplification part.

4. The distortion compensator as claimed in claim 3, wherein the predetermined correspondence correlates a greater gain with a lower power value and a smaller gain with a higher power value.

5. The distortion compensator as claimed its claim 4, wherein:

the gain control part comprises a power calculation part configured to calculate the power value of the digital transmission signal; and an address in a memory part storing the predetermined correspondence is specified by the power value.

6. The distortion compensator as claimed in claim 3, wherein the predetermined correspondence is defined so that two or more control signals having same contents are output for two or more of the possible power values, respectively, of the digital transmission signal.

7. The distortion compensator as claimed in claim 6, wherein the power value of the digital transmission signal is employed in updating and selecting the distortion compensation coefficient.

8. The distortion compensator as claimed in claim 3, further comprising an additional variable gain amplification part configured to control, in response to an additional control signal, an amplitude level of the digital transmission signal for calculating the difference.

9. The distortion compensator as claimed in claim 8, wherein the gain control part is configured to output the additional control signal in accordance with the power value of the digital transmission signal.

10. A radio transmitter with a distortion compensation function, comprising:

a distortion compensator configured to update a distortion compensation coefficient applied to a digital transmission signal so as to reduce a difference between the digital transmission signal and a digital feedback signal, the distortion compensator including a controller configured to control, in a feedback system, a level of an input signal to an analog-to-digital conversion part outputting the digital feedback signal to be compared with the digital transmission signal in accordance with magnitude of amplitude of the digital transmission signal.

11. The radio transmitter according to claim 10, wherein the controller performs the control by monitoring the level of the input signal or by using the digital transmission signal.

12. A radio transmitter with a distortion compensation function, comprising:

a distortion compensator configured to update a distortion compensation coefficient by which a digital transmission signal is multiplied so as to reduce a difference between the digital transmission signal and a digital feedback signal, the distortion compensator including:

a variable gain amplification part configured to control, in a feedback system, a level of an input signal to an analog-to-digital conversion part outputting the digital feedback signal to be compared with the digital transmission signal in response to a control signal; and a gain control part configured to output the control signal in accordance with a power value of the digital transmission signal by using a predetermined correspondence between possible power values of the digital transmission signal and gains of the variable gain amplification part.

13. A radio transmitter with a distortion compensation function, comprising:

a distortion compensator configured to update a distortion compensation coefficient by which a digital transmission signal is multiplied so as to reduce a difference between the digital transmission signal and a digital feedback signal, the distortion compensator including:

a variable gain amplification part configured to autonomously control a level of an input signal to an analog-to-digital conversion part outputting the digital feedback signal to be compared with the digital transmission signal; and a control part configured to control an amplitude level of the digital transmission signal for calculating the difference in response to the controlling of the level of the input signal by the variable gain amplification pan.

14. A distortion compensator updating a distortion compensation coefficient by which a digital transmission signal is multiplied so as to reduce a difference between the digital transmission signal and a digital feedback signal, the distortion compensator comprising:

a variable gain amplification part configured to autonomously control a level of an input signal to an analog-to-digital conversion part outputting the digital feedback signal to be compared with the digital transmission signal; and a control part configured to control an amplitude level of the digital transmission signal for calculating the difference in response to the controlling of the level of the input signal by the variable gain amplification part.

15. A distortion compensator operable to update compensating coefficient applied to a digital transmission signal, which is converted into an analog signal input to an amplifier, after applying the compensating coefficient, the distortion compensator comprising:
- a level control unit operable to control input level of a feedback signal, which is obtained based on an output signal from the amplifier, in a feedback system in accordance with a change of a level of the digital transmission signal; and
- an analog to digital converting unit operable to convert a digital signal of which level is controlled by the level control unit into a digital feedback signal to be compared with the digital transmission signal.

16. The distortion compensator according to claim 15, wherein the change of the level of the digital transmission signal is detected by monitoring the digital transmission signal or by monitoring the feedback signal.

* * * * *